United States Patent [19]

O'Toole et al.

[11] 4,418,403
[45] Nov. 29, 1983

[54] SEMICONDUCTOR MEMORY CELL MARGIN TEST CIRCUIT

[75] Inventors: James E. O'Toole; Robert J. Proebsting, both of Carrollton, Tex.

[73] Assignee: Mostek Corporation, Carrollton, Tex.

[21] Appl. No.: 275,057

[22] PCT Filed: Feb. 2, 1981

[86] PCT No.: PCT/US81/00136
§ 371 Date: Feb. 2, 1981
§ 102(e) Date: Feb. 2, 1981

[87] PCT Pub. No.: WO82/02792
PCT Pub. Date: Aug. 19, 1982

[51] Int. Cl.³ .............................................. G11C 11/40
[52] U.S. Cl. ....................................... 365/201; 371/21
[58] Field of Search ................... 365/174, 201; 371/21

[56] References Cited
U.S. PATENT DOCUMENTS

| 3,765,001 | 10/1973 | Beausoleic | 365/174 |
| 3,800,294 | 3/1974 | Lawcor | 371/21 |
| 4,195,770 | 4/1980 | Benton et al. | 365/230 |
| 4,200,919 | 4/1980 | Page et al. | 365/189 |
| 4,251,863 | 2/1981 | Rothenberger | 365/230 |
| 4,335,457 | 6/1982 | Early | 371/21 |

Primary Examiner—Terrell W. Fears

[57] ABSTRACT

A margin test circuit (10) is provided for a semiconductor memory circuit having a plurality of memory cells (16). Each of the memory cells (16) in one row of cells (16) are interconnected to a word line (14). The margin test circuit (10) further includes a row decoder/driver (12) which receives a variable voltage ($V_{cc}*$) for changing the signal level stored within a memory cell (16) to thereby determine the marginal voltage level at which the memory cell (16) will maintain storage of a signal level. The variable voltage ($V_{cc}*$) is the semiconductor memory circuit main supply source ($V_{cc}$) in normal operation but can be forced to a different voltage during the margin test.

5 Claims, 2 Drawing Figures

4,418,403

SEMICONDUCTOR MEMORY CELL MARGIN TEST CIRCUIT

TECHNICAL FIELD

This invention relates to semiconductor memory circuits, and more particularly to a semiconductor memory cell margin test circuit for margin testing of memory cells.

BACKGROUND ART

Integrated circuit semiconductor memories must, of necessity, operate with a high degree of reliability in order to be used in computer related applications. The production of errors on even infrequent occasions can cause serious problems in computer controlled operations and data processing. The nature of MOSFET (metal-oxide-semiconductor field-effect transistor) memories is such that error conditions are not always consistent but frequently occur only under unique circumstances. In mass produced memory circuits, certain ones of the memories will have greater resistance to error conditions while others will be more prone to the generation of errors.

Testing schemes have therefore been developed to determine the reliability of such semiconductor memory devices under normal and subnormal operating conditions. In semiconductor memory testing, memory cells are exercised in a number of ways in order to determine if weak or misfunctioning cells exist. The identification of these weak cells or marginally acceptable cells results in rejection of the entire semiconductor memory or substitution for these unacceptable cells using redundant elements.

A common method for testing semiconductor memories is to apply a reduced supply voltage to the semiconductor memory which causes an abnormal reduction in operating margin, thereby accentuating some weaknesses and potential failures. Margin testing has heretofore been accomplished with an adjustable supply voltage to measure the operating margins of stored cell voltages for a memory circuit. This testing permits sorting of circuits according to margin levels. With the possibility of such sorting, purchasers of memory products can select the high margin circuits and reject others even though other circuits meet manufacturing specifications. The rejected low margin circuits may be returned to the manufacturer even though they are functional. This practice causes an economic loss to the manufacturer and eventually increases the cost of such memory circuits. Margin testing therefore plays an important test function in the manufacture of semiconductor memory circuits.

Previously developed margin testing techniques in which reduced power supply voltages are supplied to the entire semiconductor memory do not adequately test the memory cell array to determine marginally operating cells. Use of a reduced power supply voltage tests the entire array interface circuitry including the sense amplifiers, input and output buffers, chip select buffer, data input and write enable circuitry. This circuitry is utilized to read and write the memory cells.

In typical margin testing, the supply voltage for the entire semiconductor device would be lowered until the device fails. The failure could occur in either the memory array or in the peripheral interface circuitry. If the peripheral circuitry fails at a higher supply voltage than the memory cells, then the memory cells cannot be tested for margins below that supply voltage. For example, if the semiconductor device is rated to operate between, for example, 4.5 volts and 5.5 volts, devices that only work down to 4.0 volts, for example, would be rejected. However, even if a semiconductor device did not fail during a margin test down to the minimum acceptable voltage level, it is still possible for a weak cell to exist in the semiconductor memory array that does not cause a complete failure of the semiconductor memory. In the above example, it is possible that a weak cell exists but which cannot be detected until its supply is reduced to, for example, 3.0 volts. If the peripheral circuits fail at a higher supply voltage than 3.0 volts, for example, 3.5 volts, then the marginal nature of the weak cell at 3.0 volts cannot be detected, yet the part is a "good" part since it passes the margin test down to 4.0 volts. Therefore, marginally reliable cells may go unidentified because the failure of a memory device could be due to loss of a margin in the peripheral circuits without the opportunity to sufficiently stress the memory cells themselves.

A need has thus arisen for a margin test circuit which isolates the semiconductor memory cells for margin testing without affecting the operation of the peripheral circuits which read or write the memory cell being tested. Such a margin test circuit allows the determination of potentially unreliable cells that may normally pass pattern testing and overall semiconductor device margin testing in which the supply voltage for the entire part is reduced.

DISCLOSURE OF THE INVENTION

In accordance with the present invention, a semiconductor memory cell margin test circuit is provided for testing the operating margin of semiconductor memory cells by reducing the operating margin of the memory cells during the test while retaining the operating margin of peripheral circuit elements.

In accordance with the present invention, a margin testing circuit is provided for a semiconductor memory having a plurality of memory cells wherein the memory cells are arranged in rows, those memory cells along one row being connected to a word signal line. The testing circuit includes circuitry interconnected to a word signal line for varying the voltage applied to the word signal line to test overall operation of each memory cell in both write and read operations with reduced voltage on the word signal line.

In accordance with another aspect of the present invention, a method is provided for separating memory cells of a semiconductor memory circuit having acceptable operating margins from memory cells having unacceptable operating margins. The method comprises testing the semiconductor memory circuit with a selected word signal line operating at a reduced voltage while operating the semiconductor memory circuit peripheral circuits at normal voltage.

BRIEF DESCRIPTION OF DRAWINGS

For a more complete understanding of the present invention and for further advantages thereof, reference will now be made to the following Detailed Description taken in conjunction with the accompanying Drawings in which.

DETAILED DESCRIPTION

Figure 1:
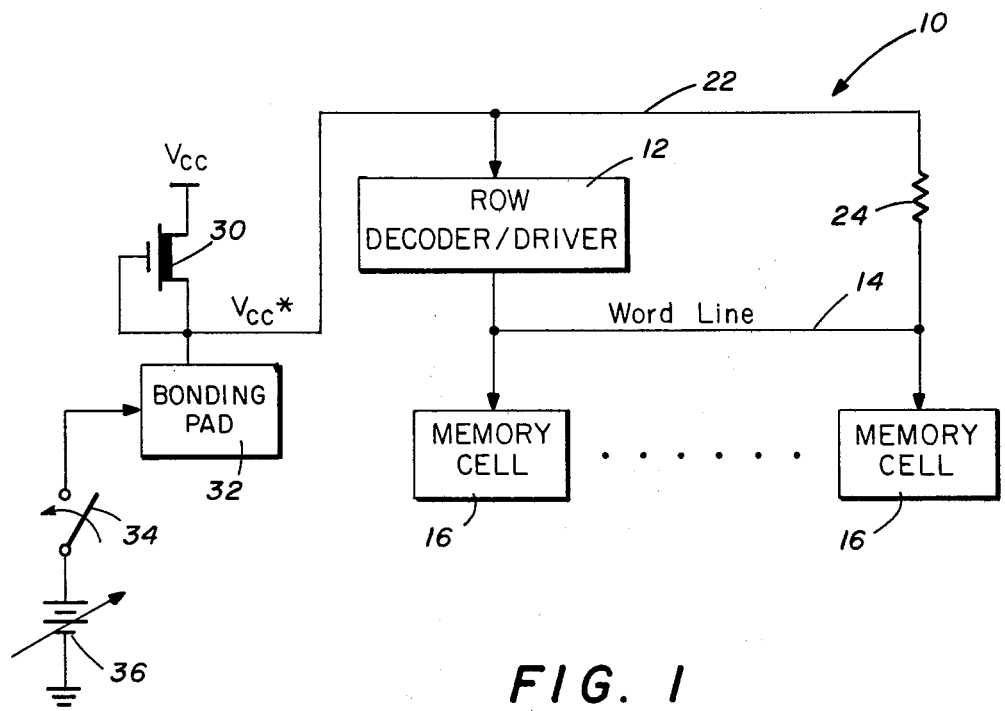
FIG. 1 is a block diagram of the present semiconductor memory cell margin test circuit.

Referring to FIG. 1, the present margin test circuit for a semiconductor memory integrated circuit is illustrated in block diagram form and is generally identified by the numeral 10. Margin test circuit 10 includes a row decoder/driver 12 for selecting one row of the semiconductor memory circuit. The output of row decoder/driver 12 is applied to a word line 14 which is interconnected to a plurality of memory cells 16. The output of row decoder/driver 12 when selected, causes a logic high to be placed on word line 14 to select a corresponding row of memory cells 16.

Memory cells 16 may comprise, for example, static type read/write cells or dynamic type read/write cells, as well as normal or programmable read only memory cells. Such a static memory cell is illustrated in U.S. Pat. No. 3,967,252 issued to Donnelly on June 29, 1976 and entitled "Sense Amp for Random Access Memory". As is well known to those skilled in the art, the voltage to which the word line of a semiconductor memory is driven is a major factor in determining the state or condition of the voltages present within a memory cell. The higher the voltage on the word line, the more conductive the access transistor becomes, thereby determining a higher voltage level that can be written into the memory cell or the larger current or more charge that can be transferred in reading the memory cell. Therefore, it can be seen that the voltage level written into a memory cell can be controlled by the voltage applied to the word line.

The present margin test circuit 10 permits testing the margin of memory cells 16 without affecting the operation of the peripheral circuitry which reads or writes the memory cell 16 being tested. By controlling the voltage level on word line 14, the present margin test circuit 10 tests the operating margin of memory cell 16 itself. This testing allows the writing of a reduced voltage into memory cell 16 in order to reduce the memory cell's margin against changing states or flipping from a logic high to a logic low, or from a logic low to a logic high, and then allows the exercising of the entire semiconductor memory at the supply source voltage in order to determine if marginal cells are present.

Margin test circuit 10 generates a voltage, $V_{cc}^*$ which is applied via a signal line 22 to row decoder/driver 12. Interconnected to signal line 22 is a resistor 24 which functions to hold word line 14 at the supply voltage $V_{cc}$ for extended periods of time. Even if row decoder/driver 12 is incapable of maintaining $V_{cc}$, since there is no current supplied by word line 14 other than leakage current, resistor 24 is sufficient to maintain that voltage. Resistor 24 may comprise an actual resistor or a high impedance transistor such as, for example, a depletion load device.

Signal line 22 is interconnected to a transistor 30 which is interconnected to the memory cell supply voltage, $V_{cc}$. Transistor 30 is a highly conductive depletion mode transistor. In the normal operation of the semiconductor memory, transistor 30 will pull signal line 22 to the value of $V_{cc}$.

Margin test circuit 10 includes an internal bonding pad 32 which is fabricated on the semiconductor substrate on which the semiconductor memory is fabricated. Bonding pad 32 can be used as a probe test to be connected through a switch 34 to a variable voltage supply 36. Bonding pad 32 may also be connected to a pin for external testing of the semiconductor memory circuit.

In the margin test mode, switch 34 is closed such that the voltage level on signal line 22, $V_{cc}^*$, can be decreased by forcing the voltage on bonding pad 32 low through operation of variable voltage supply 36, which may require sinking of current through transistor 30 on the order of 10–20 milliamps. It therefore can be seen that by controlling the voltage level of $V_{cc}^*$, the supply voltage to row decoder/driver 12 and resistor 24, the maximum voltage to which word line 14 is driven is thereby controlled. By controlling the maximum voltage to which word line 14 is driven, the voltage level written into a memory cell 16 can be controlled.

Utilizing the present margin test circuit 10 in a test procedure, the voltage on a selected word line 14 would initially be high to the value of $V_{cc}$, for example, 5 volts. Any high or low state would be stored within a memory cell 16 and then read to determine whether the stored state remains stored. The test would then be repeated while reducing $V_{cc}^*$ to reduce the word line voltage on each trial. After each reduction of $V_{cc}^*$ the memory cell 16 would be read to determine whether the stored voltage level remains or whether the stored voltage level has flipped.

During the test, the operating voltage of the peripheral circuits of the semiconductor memory is maintained at the normal operating voltage such that the present margin test circuit 10 isolates memory cells 16 for testing. $V_{cc}^*$ would continually be decreased until many memory cells 16 begin to fail. At that point, either the results of previous testing would be stored or the voltage on word line 14 could be increased towards $V_{cc}$ to determine if there are any particular cells that fail at a higher word line voltage than other cells, indicating that their margin against flipping is not statistically close to the remaining cells of the semiconductor memory array. Therefore, a marginal memory cell can be identified by comparison to the remainder of memory cells 16 of the semiconductor memory array.

Figure 2:
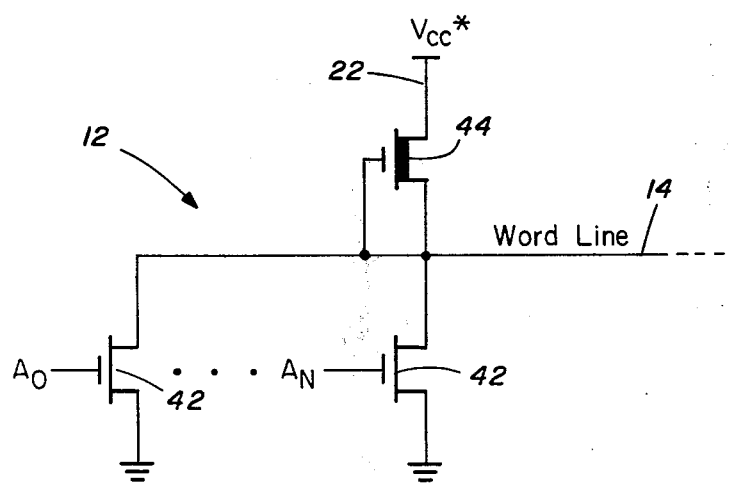
FIG. 2 is a schematic circuit diagram illustrating a typical circuit corresponding to a row decoder/driver illustrated in FIG. 1.

FIG. 2 illustrates a typical circuit for use as row decoder/driver 12 (FIG. 1). A plurality of transistors 42 are interconnected to word line 14. Transistors 42 receive address signals $A_0$–$A_N$ for selecting a particular word line 14. A depletion load device 44 is interconnected between word line 14 and signal line 22, the $V_{cc}^*$ voltage supply. When $A_0$–$A_N$ are low, depletion load device 44 will pull word line 14 high to the value of $V_{cc}^*$, such that the voltage level of $V_{cc}^*$ is transmitted to word line 14. Row decoder/driver 12 may comprise, for example, a typical NOR decoder. For the decoder/driver 12 illustrated, no resistor 24 (FIG. 1) is required since the decoder/driver can maintain the word line voltage at $V_{cc}^*$ indefinitely. Some decoder/driver circuits cannot maintain this voltage and therefore require the use of resistor 24.

It therefore can be seen that the present margin test circuit 10 permits the writing of a reduced voltage into a memory cell in order to reduce the memory cell's margin against flipping and further allows for the normal exercising of the semiconductor memory at the operating voltage of the peripheral circuits. The present margin test circuit 10 permits isolated testing of memory cells at reduced voltage levels independent of margin testing of the overall memory circuit.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A margin testing circuit for a semiconductor memory circuit having a plurality of memory cells, the memory cells being arranged in rows and those memory cells along one row being connected to a word signal line and the semiconductor memory circuit operating at a supply voltage, comprising:
   means interconnected to a word signal line for varying the voltage applied to a word signal line without varying the supply voltage to test for proper functioning of the memory cells along a row of the semiconductor memory circuit while operating with reduced voltage on the selected word signal line.

2. The margin testing circuit of claim 1 wherein said means for varying the voltage applied to the word signal lines includes:
   a voltage supply source;
   drive means interconnected to said voltage supply source and to the word signal line for driving the word signal line to a voltage dependent on said voltage supply source; and
   control means for controlling the voltage level supplied to said voltage supply source.

3. In a semiconductor memory circuit fabricated on a semiconductor substrate, having a plurality of memory cells wherein memory cells are connected to a word signal line, the semiconductor memory circuit having peripheral circuitry and operating from a supply voltage source, a margin test circuit comprising:
   drive means interconnected to the supply voltage source and to the word line for driving the word line; and
   control means interconnected to the supply voltage source and to said drive means for controlling the voltage level supplied from the supply voltage source to said drive means to thereby change the voltage level applied to the word signal line while maintaining the semiconductor memory circuit peripheral circuitry at the supply voltage source.

4. The margin test circuit of claim 3 wherein said control means is external of said semiconductor substrate.

5. A method for separating memory cells of a semiconductor memory circuit having acceptable operating margins from memory cells having unacceptable operating margins comprising the steps of:
   testing the semiconductor memory circuit with a selected word signal line operating at a reduced voltage; and
   operating the semiconductor memory circuit peripheral circuitry at normal voltage.

* * * * *